United States Patent
Kaviani

(10) Patent No.: US 6,914,449 B2
(45) Date of Patent: Jul. 5, 2005

(54) STRUCTURE FOR REDUCING LEAKAGE CURRENT IN SUBMICRON IC DEVICES

(75) Inventor: Alireza S. Kaviani, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 957 days.

(21) Appl. No.: 09/825,224

(22) Filed: Apr. 2, 2001

(65) Prior Publication Data

US 2002/0141234 A1 Oct. 3, 2002

(51) Int. Cl.$^7$ .......................................... H03K 19/173
(52) U.S. Cl. ........................ 326/41; 326/37; 326/47; 326/17
(58) Field of Search ..................... 326/37–41, 47, 326/17, 33

(56) References Cited

U.S. PATENT DOCUMENTS

| | | |
|---|---|---|
| 5,332,929 A | 7/1994 | Chiang |
| 5,399,924 A | 3/1995 | Goetting et al. |
| 5,726,946 A | 3/1998 | Yamagata et al. |
| 5,825,198 A | 10/1998 | Sakata et al. |
| 5,898,320 A | 4/1999 | Li et al. |
| 5,914,616 A | 6/1999 | Young et al. |
| 6,292,015 B1 * | 9/2001 | Ooishi et al. ............... 326/33 |

* cited by examiner

*Primary Examiner*—Anh Q. Tran
(74) *Attorney, Agent, or Firm*—Scott R. Brown; Edel M. Young; Lois D. Cartier

(57) ABSTRACT

A technique for reducing leakage current in static CMOS devices by adding additional transistors in series between selected inverters or logic gates and ground or power. NMOS and PMOS transistors are added to selected buffers comprised of two inverters in series. The PMOS transistor is connected between the first inverter and power and the NMOS transistor is connected between the second inverter and ground. The added transistors are controlled by a memory cell to be on when the buffer is being used and off when the buffer is unused. Alternatively, no PMOS transistor is added and an existing PMOS transistor of the first inverter is manufactured to sit in a $V_{gg}$ well. The same techniques are employed with selected buffer pairs and logic gates.

12 Claims, 9 Drawing Sheets

STRUCTURE FOR REDUCING LEAKAGE CURRENT IN SUBMICRON IC DEVICES

FIELD OF THE INVENTION

The present invention relates to reducing power consumption in integrated circuit chips and more particularly to reducing power consumption by reducing leakage current in submicron IC devices, particularly deep submicron CMOS IC devices.

BACKGROUND

It is expected that future electronic systems will continue to require ever increasing speed and that they consume as little power as possible. To attain higher speeds and maintain low power consumption, integrated circuit (IC) chips, as one of the principle components of electronic systems, will need to operate at ever higher frequencies while consuming as little power as possible. For IC chips manufactured using CMOS technology, as device sizes shrink to increase speed and reduce chip size, increased static power consumption will become a major hurdle to attaining low power consumption goals. Static power is consumed by circuits, and, individual devices that are not actively changing states, i.e., the transistors are in a steady off state. Up until now, static power consumption in CMOS technology has been negligible. But the continued shrinking of device sizes will change this.

Continuing process advancements have allowed for reductions in critical dimensions in CMOS manufacturing. IC device dimensions have now reached or are about to reach a critical point where static power consumption will become a major concern unless new techniques are implemented to avoid unacceptable static power consumption levels. As device sizes have shrunk there has been a reduction in power supply voltage ($V_{dd}$). While lower $V_{dd}$ corresponds to lower dynamic power consumption, it also reduces the speed of the device. To maintain or increase device speed, efforts have been pursued to reduce the threshold voltage ($V_{th}$) of transistors within a given process. However, the subthreshold voltage current, or leakage current, of a transistor exponentially increases with any $V_{th}$ decrease. At prior larger device dimensions, this exponential leakage current increase was still negligible. But, at current and future device dimension sizes, this exponential increase in leakage current will result in a rapid and noticeable increase in static power consumption. Thus, without employing a new approach, the designer may be required to make unacceptable trade off decisions between speed and power consumption.

To counteract this increasing power consumption problem, it would be possible to increase the voltage threshold level of the transistors, however, this would have negative impacts on the transistor speed or frequency at which the device could be used. Furthermore, increasing $V_{th}$ can introduce other problems because of noise margins that must be maintained within the device. It has been found that increasing $V_{th}$ to more than $V_{dd}/3$ will negatively impact the functionality of the device.

As device sizes continue to shrink, this static power consumption issue will become more important for the entire semiconductor industry. This is particularly important now for makers of chips such as Field Programmable Devices (FPDs) with a large number of transistors on a single die, of which the majority will remain in a static off state.

An FPD is a programmable logic device comprised of an array of Configurable Logic Elements (CLEs) surrounded by a General Routing Matrix (GRM) with a periphery of input/output ports. In general, FPDs include programming elements such as static random access memory cells (SRAMs), antifuses, EPROMs, Flash cells, or EEPROMS. These memory elements are used to control the functions performed by the CLEs, the routing of signals in the GRM between CLEs, and the functionality of the input/output ports. Recently, FPD makers have trended toward providing a large number of drivers or buffers to support high fan out signals to be routed in the GRM. An FPD is designed to perform any logic function required by a user.

In practice, once a FPD user designs the function to be implemented by the FPD, and the FPD is programmed to perform the function, a large number of the resources available on the FPD are unused. Thus, the FPD may have a large percentage of transistors that are not being used at any given time. Xilinx, a leading manufacturer of FPDs, makes a variety of FPD known as a field programmable gate array (FPGA). Analysis of typical designs used by users of Xilinx FPGAs shows that anywhere from 60 to 90 percent of the FPGA resources are typically unused. These unused resources are in a static mode and thus as static power consumption increases for a given process the FPGA or FPD is likely to see large increases in overall power consumption.

It is desirable then to implement new circuit techniques that will operate at increased speeds and reduce leakage current in CMOS devices and thereby reduce IC chip power consumption.

SUMMARY OF THE INVENTION

The present invention solves the above-described problems and provides a distinct advance in the art of CMOS IC design. More particularly, the present invention provides a technique for reducing leakage current in static CMOS devices by adding additional transistors in series between selected inverters or logic gates and ground or power.

In a first separate aspect of the invention, NMOS and PMOS transistors are added to selected buffers comprised of two inverters in series. The PMOS transistor is connected between the first inverter and power supply and the NMOS transistor is connected between the second inverter and ground. The added transistors are controlled by a memory cell to be on when the buffer is used and off when the buffer is unused.

In a second separate aspect of the invention an NMOS transistor is added to selected buffers comprised of two inverters in series. The NMOS transistor is connected between the second inverter of a selected buffer and ground and controlled by a memory cell to be on when the buffer is used and off when the buffer is unused. A PMOS transistor of the first inverter is manufactured to sit in a $V_{gg}$ well.

In a third separate aspect of the invention an NMOS transistor is added to selected buffer pairs each of which is comprised of two inverters in series. A single NMOS transistor is connected between the second inverter of each selected buffer and ground and controlled by a memory cell to be on when one or both of the buffers are used and off when both of the buffers are unused. A PMOS transistor of the first inverter in each buffer is manufactured to sit in a $V_{gg}$ well.

In a fourth separate aspect of the invention each of the above recited techniques are employed in drivers used to drive signals onto high capacitance interconnect lines where the drivers comprise buffers made of logic gates in series with an inverter.

In a fifth separate aspect of the invention each of the above recited techniques are employed in the circuitry of a field programmable gate array.

These and other important aspects of the present invention are described more fully in the detailed description below.

BRIEF DESCRIPTION OF THE DRAWINGS

A preferred embodiment of the present invention is described in detail below with reference to the attached drawing figures, wherein.

Figure 1:
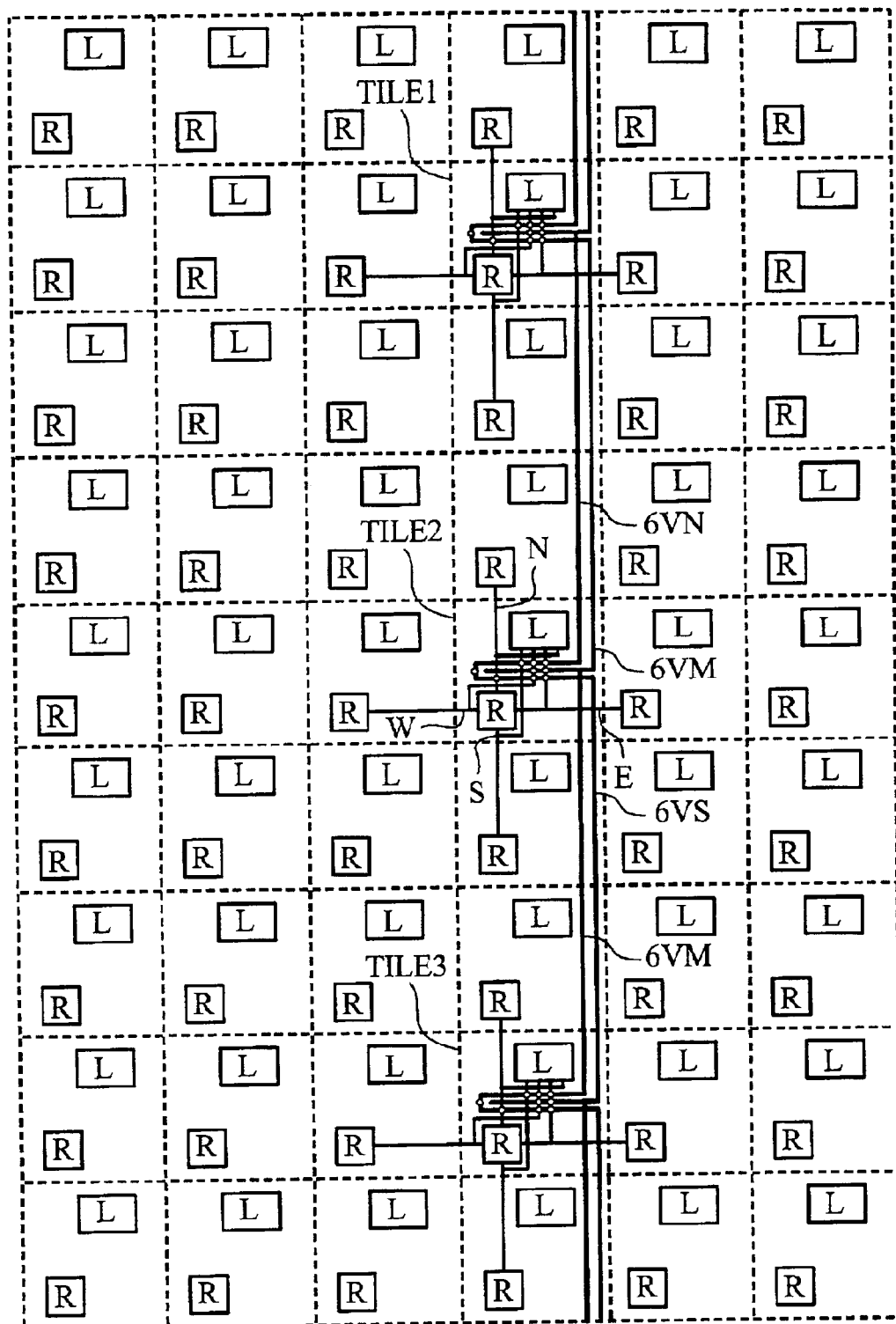
FIG. 1 is a high-level block diagram depicting an FPGA with which the present invention may be used.

The drawing figures do not limit the present invention to the specific embodiments disclosed and described herein.

DETAILED DESCRIPTION

Although the circuit techniques described herein are not limited to use in FPDs, each embodiment of the invention will be described with reference to a particular FPGA manufactured by Xilinx, Inc., commercially known as the Virtex® FPGA. (Virtex is a registered trademark of Xilinx, Inc., owner of the present patent application.) Turning to the drawing figures, and particularly to FIG. 1, one FPGA, which may be constructed in accordance with an embodiment of the invention, is illustrated.

FIG. 1 is a block diagram depicting the general architecture of an FPGA. FIG. 1 illustrates part of an array of tiles in an FPGA. Each tile includes a logic block L and a routing or switching structure R. Also in each tile are line segments which connect to line segments in adjacent tiles to form interconnect lines. The CLEs mentioned above are contained in the logic blocks L and the interconnect lines and switching structures R combine to form the GRM. Most of the interconnect lines in the FPGA are not shown in FIG. 1 so as not to obscure the figure. Three of the tiles, labeled TILE 1, TILE 2, and TILE 3 are shown in more detail. Short and intermediate length interconnect lines are shown extending between TILE 1, TILE 2, TILE 3, and their immediate neighbors. The heavy black lines labeled 6VM, 6VN, and 6VS represent interconnect lines running generally in a north-south direction spanning multiple tiles. There are similar interconnect lines running horizontally in the device but not shown. The single length lines of TILE 2 labeled N, S, E, and W represent multiple lines connecting between adjacent tiles and connecting to the logic block L of TILE 2. The details of the interconnection architecture such as the numbers of conductive lines and their length are not important to the invention and will only be discussed as necessary with respect to later figures. The logic blocks L represent logic function generators. In the FPGA of FIG. 1 these logic blocks comprise a plurality of lookup tables.

Included in the FPGA of FIG. 1, but not shown, is an array of memory cells that are used to control the functionality of the logic blocks L as well as the connection of the interconnect lines to each other. These memory cells may be SRAM cells, Flash cells, EPROMs, EEPROMs, or anti-fuses, but are SRAM cells in the preferred FPGA. In general, the interconnect lines are connectable to each other and the single length lines may also be connected to the logic block L. At the periphery of the tile array are input/output blocks containing input/output ports, which are not shown on FIG. 1. The functionality of the input/output ports is also controlled by memory cells.

Figure 2:
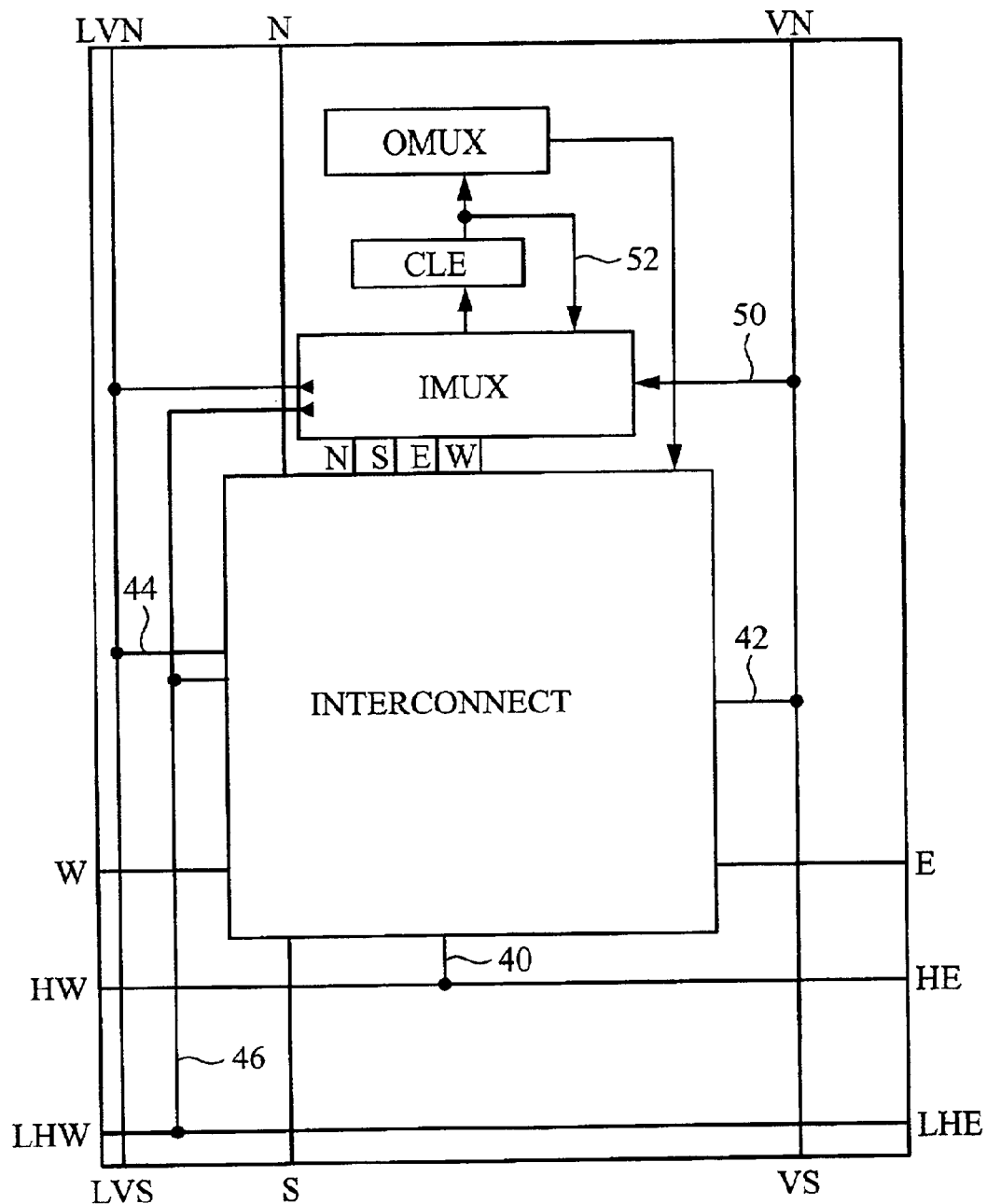
FIG. 2 is a more detailed block diagram showing one tile of FIG. 1.

Turning to FIG. 2, the details of a single tile are depicted at a block diagram level. The tile includes vertical and horizontal lines, each representing a plurality of conductive traces on which logic data signals may be routed. In general, there are three varieties of conductive lines that enter and exit at the periphery of the tile. These varieties include long lines (LVN, LVS, LHE, LHW), intermediate lines (VN, VS, HE, HW), and direct connect lines (N, S, E, W). The long lines extend for the entire length or width of the array, or half of the length or width of the array in a second embodiment. The intermediate lines extend for multiple lengths of tiles (six or two tiles in this embodiment). The direct connect lines connect between adjacent tiles.

There are four major functional blocks depicted in FIG. 2. The first is a region labeled NON-LOCAL INTERCONNECT. Within this region each of the direct connect lines N, S, E, W may be connected to each other, some of the intermediate length lines 40, 42 can be connected to each other, some of the intermediate length lines 40, 42 can be connected to the direct connect lines, and some of the long lines 44, 46 can be connected to intermediate length lines. A detailed description of a similar interconnection scheme may be found in U.S. Pat. No. 5,914,616 entitled "FPGA Repeatable Interconnect Structure with Hierarchical Interconnect Lines", which is hereby incorporated by reference. The connections that will be made are determined by the programming of memory cells that control NMOS pass transistors.

The second major functional block is labeled IMUX. The IMUX region comprises multiplexers that determine which signals will be input to the CLE. The multiplexers are comprised of buffered NMOS pass transistors controlled by memory cells. Each of the direct-connect lines N, S, E, W is an input to the IMUX region. In addition, some of the intermediate length lines 50 and some of the CLE output lines 52 are connected into this region.

The third major functional block is labeled CLE. Within this region are logic function generators that, in one embodiment, comprise lookup tables (LUT). The LUTs comprise memory cells that are programmed to perform the user's logic function.

The fourth major functional block is labeled OMUX. The OMUX region comprises multiplexers that select which of the CLE outputs will be connected back into the NON-LOCAL INTERCONNECT region to be distributed to other tiles or input/output ports. The tile of FIG. 2 is further described in U.S. Pat. No. 5,914,616.

Figure 3:
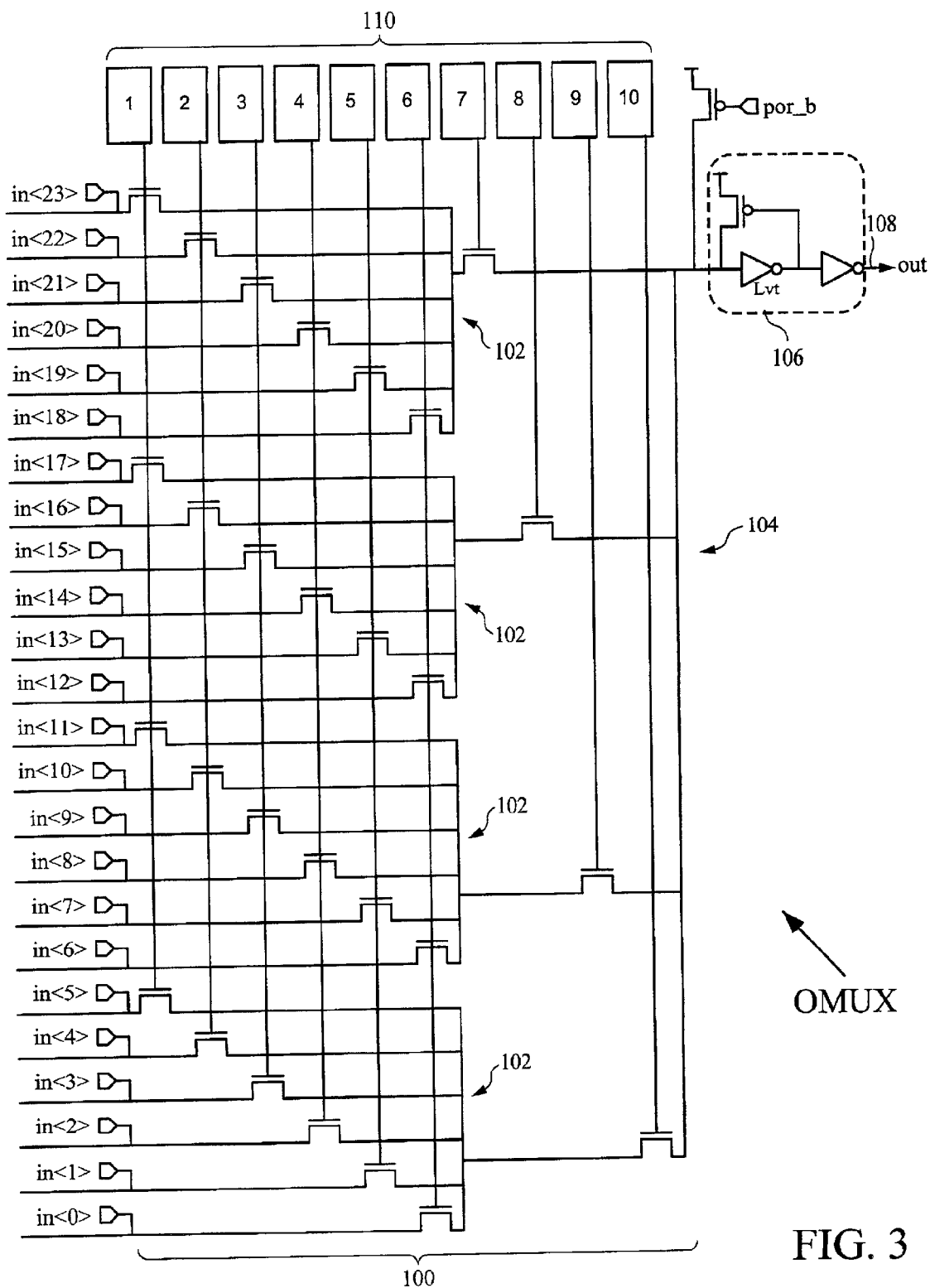
FIG. 3 is a schematic diagram of a portion of the OMUX of FIG. 2.

Turning to FIG. 3, a schematic diagram of one of the multiplexers from the OMUX region is depicted. On the left of the diagram are 24 inputs, labeled IN0–IN23, that are connected on the right to a pass transistor selection matrix 100. The pass transistor selection matrix is comprised of two stages. At the first stage, four of the 24 inputs are selected to pass through to the second stage where one of the four inputs is passed to the output. In the first stage, the 24 inputs are grouped into four groups of six. For example, IN16–IN23 make up the top group. A pass transistor is connected to each input line on one side and to a first stage common node 102 on the other side. Thus, there are four first stage common nodes 102, and each first stage common node is an input to a second stage pass transistor. The second stage pass transistors each have one side connected to one of the first stage common nodes and the second side connected to a second stage common node 104. There is one second stage pass transistor associated with each of the four groups. The second stage common node 104 is input to a buffer 106 comprised of two inverters connected in series. The output 108 of the buffer becomes one of the outputs from the OMUX region. In the example FPGA there are 16 such multiplexers in the OMUX region. Across the top of the selection matrix are memory cells 110 with outputs connected to the control gates of the pass transistors. The memory cells are powered by a Vgg voltage, which is 10–15% higher than the supply voltage Vdd. This minimizes voltage drop across the NMOS pass transistors when passing logic 1. From left to right, the first six memory cells each control four separate pass transistors, one from each of the four groups in the first stage of the selection matrix 100. The remaining four memory cells control a single pass transistor in the second stage of the selection matrix. The por_b signal is a reset signal, and goes low only at power-up, to cause all output signals to be logic 1. The transistor controlled by por_b is very small, and its static power leakage is therefore negligible.

In operation, software ensures that only one of the first stage memory cells and one of the second stage memory cells are programmed with a logic "1" so that only one path is conducting and there is no contention. For example, IN23 will be passed to the second common node 104 when the first and seventh memory cells are programmed with a logic "1". The remaining memory cells will each be programmed with a logic "0". With the appropriate programming, any one of the 24 inputs can be selected to drive the OMUX output.

Figure 4A:
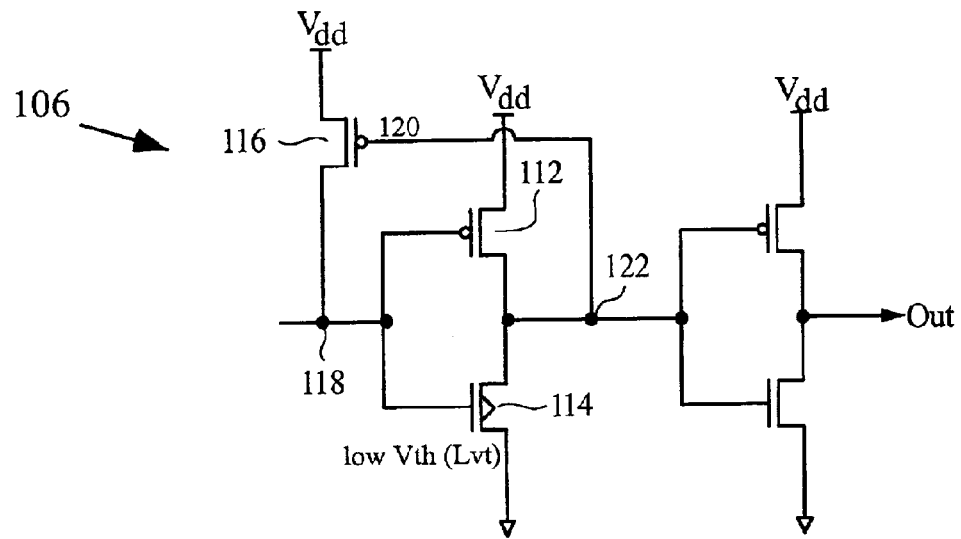
FIGS. 4A and 4B show schematic diagrams of one embodiment of the stacking technique of the invention.
Figure 4B:
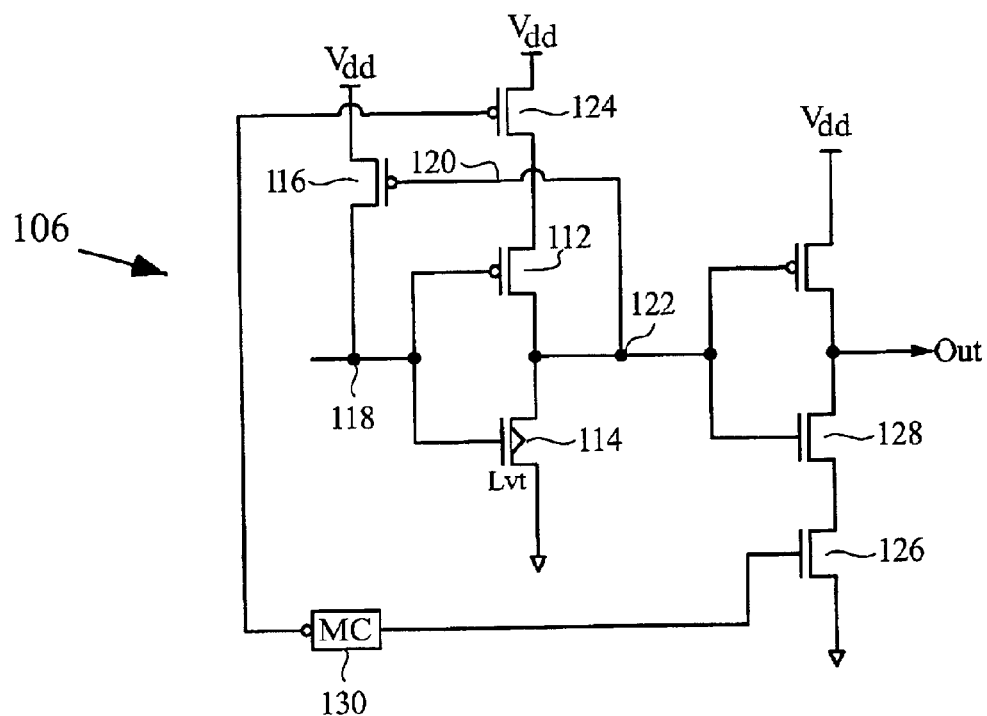

FIGS. 4A and 4B show one embodiment of a circuit design technique referred to as transistor stacking. FIG. 4A shows the detailed circuit 106 implementation including the two inverters of FIG. 3. The control gate 120 of PMOS transistor 116 is connected to the first inverter output 122. PMOS transistor 116 acts as a pull-up transistor speeding signal propagation when a weak high voltage signal is present on inverter input 118. The output of the first inverter 122 is connected to the input of the second inverter, which is a standard CMOS inverter. These inverters operate together to form a buffer, as is well known to one of ordinary skill in the art. In order to maximize switching speed while not excessively increasing leakage, only one transistor 114 in buffer 106 is made to be a low threshold transistor. (The triangle symbol in transistor 114 indicates that it is a low threshold transistor.) Transistor 114 is chosen because it is part of the first inverter stage of the buffer, and therefore of smaller size than those of the second stage. Also, the NMOS transistor 114 rather than the PMOS transistor 112 is chosen to be low threshold because high switching speed is important in the presence of a rising input signal at node 118. Note that transistor 114 will be on when buffer 106 is not used, and because there is no voltage drop across transistor 114 when it is on, this low threshold transistor will not consume static power.

FIG. 4B depicts the same circuit but with two additional transistors and a memory cell added. For ease of reference, like structures are given identical numbers. The first inverter has an additional PMOS transistor 124 connected between PMOS transistor 112 and $V_{dd}$. Transistor 124 is referred to as a virtual $V_{dd}$ transistor. The second inverter has an additional NMOS transistor 126 connected between NMOS transistor 128 and ground. This additional NMOS transistor is referred to as a virtual ground transistor. The control gates of virtual $V_{dd}$ transistor 124 and virtual ground transistor 126 are connected to the complemented and true output of a memory cell 130 respectively. Depending on the requirements of the FPGA user's design, any given switch and its corresponding buffer in the OMUX region may or may not be used. If the particular buffer is used, memory cell 130 will be programmed to turn both virtual transistors on, and the first inverter will be connected to power and the second inverter will be connected to ground. In this state, the buffer will act essentially as if the virtual power and ground transistors did not exist. If the buffer is unused, memory cell 130 will be programmed to turn the virtual transistors off.

The addition of the stacked virtual transistors significantly reduces the leakage current associated with the buffer. When the switch or buffer is not used, depending on device sizes, leakage current will be reduced by a factor of 10–20. This can be shown mathematically using the sub-threshold current formula in BSIM 3.3 spice models. Simulation of this stacking concept in a 0.15 micron process and in a 0.18 micron process confirm these results. Similar results also show that stacking will reduce the sub-threshold current even further in dimension sizes smaller than the 0.15 micron process technology. Therefore, as the process technology shrinks, utilizing the stacking concept becomes more advantageous.

Figure 5:
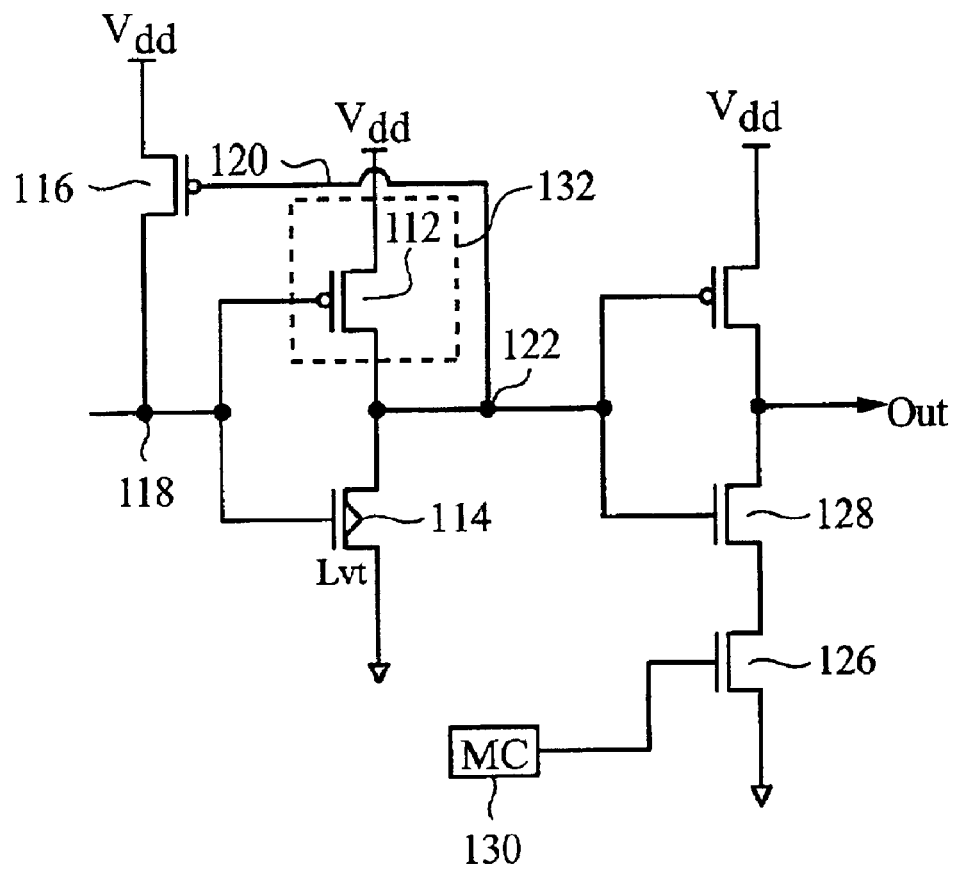
FIG. 5 is a schematic diagram of one embodiment of the stacking technique of the invention.

Addition of the virtual power and ground transistors comes with the penalty of increased area required for each buffer. FIG. 5 shows an alternative embodiment in which one of the virtual transistors 124 from FIG. 4, virtual $V_{dd}$, is eliminated. In this embodiment, no virtual $V_{dd}$ transistor is added, but, the PMOS transistor 112 of the first inverter should be manufactured to sit in a $V_{gg}$ well, indicated by region 132. $V_{gg}$ refers to a voltage which is typically 10–15% higher than normal power, $V_{dd}$. Simulation results in a 0.15 micron process technology show that manufacturing the PMOS transistor 112 to sit in a $V_{gg}$ well reduces its leakage current by a factor of more than 2. This is mainly due to the dependency of threshold voltage on $V_{bs}$, the voltage between the base or substrate well and the source terminal of the transistor. When the source of a PMOS transistor is connected to $V_{dd}$ and the base or well is connected to $V_{gg}$, $V_{bs}$ will be equal to $V_{gg}-V_{dd}$, causing a reduction in the leakage current.

Figure 6:
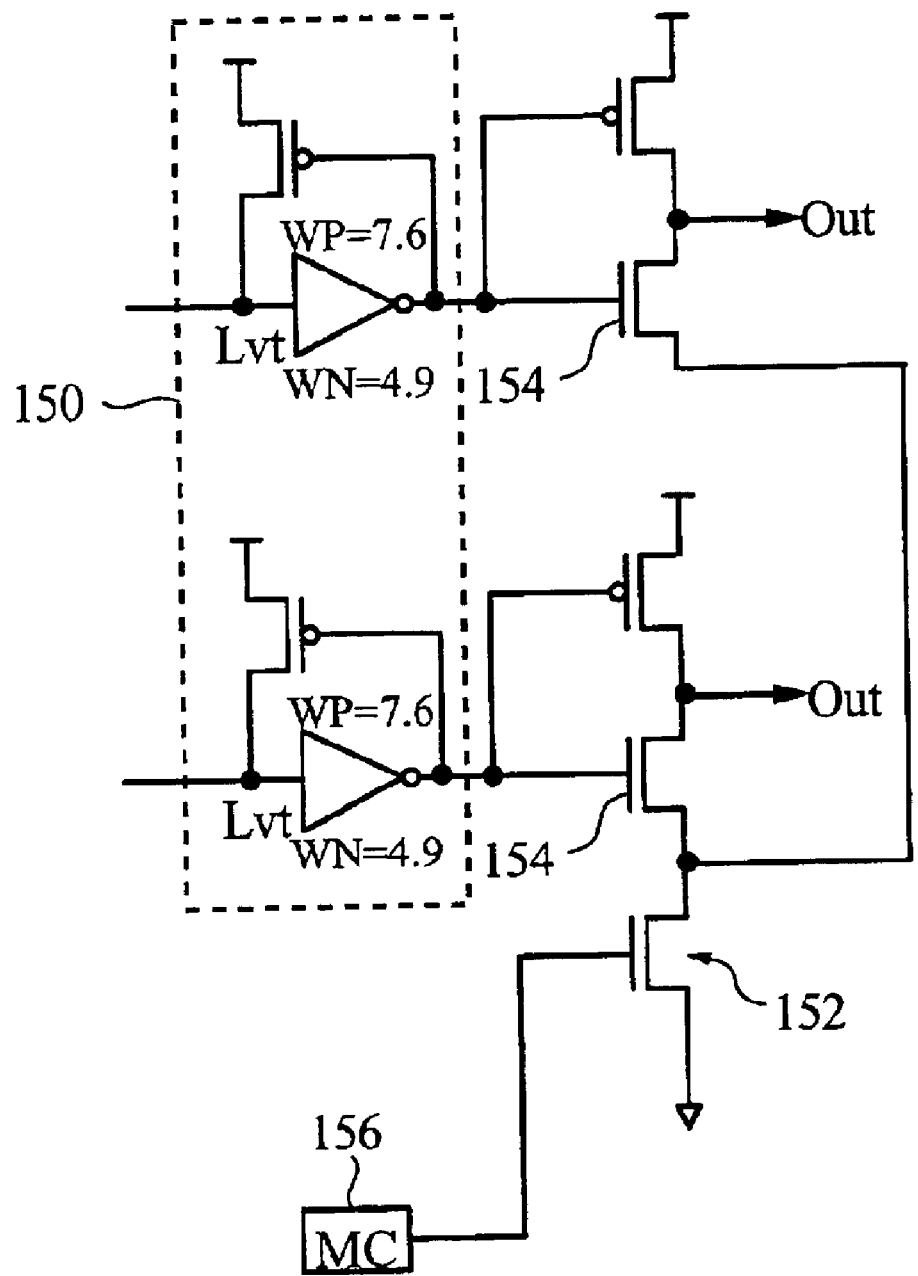
FIG. 6 is a schematic diagram of one embodiment of the stacking technique of the invention.

FIG. 6 shows yet another alternative embodiment, which, in addition to eliminating the virtual $V_{dd}$ transistors by manufacturing the inverter PMOS transistors in a $V_{gg}$ well, groups OMUX output buffers into pairs so that each buffer pair shares a common virtual ground transistor. In this figure, the first inverter stage of each buffer 150 (now schematically shown by the common logic symbol) is manufactured identically as described with respect to FIG. 5. The second stage differs in that only one virtual ground transistor 152 is added for each buffer pair and the source of the NMOS transistor 154 from each second stage inverter is connected to the drain of the virtual ground transistor 152. A single memory cell 156 controls virtual ground transistor 152 for the buffer pair. This embodiment further reduces the area penalty incurred by stacking by cutting in half the number of virtual ground transistors and the number of memory cells that would be needed to implement the stacking technique of FIG. 5 for each OMUX output buffer.

However, the FIG. 6 embodiment adds complexity to the "place and route" software needed to program the FPGA. Place and route software is part of the automated tool used to implement a design in an FPGA. Briefly, after a user determines the functionality required of an FPGA, that design is implemented by automated software tools that determine how to configure the logic blocks and connect them together. The place and route step in this process determines which logic blocks and which interconnect lines will be used to implement the user's logic and connect the logic blocks together. The stacking technique embodiment of FIG. 6 complicates the place and route analysis because to maximize the reduction in static power consumption, used and unused buffers in a given design should be separated into different groups. There is no static power consumption savings if the virtual ground transistor of an unused buffer is turned on. Thus, to the extent possible, the place and route software should attempt to route pairs of active signals through buffer pairs that share the same virtual ground transistor.

In cases where resource utilization is very low, the leakage savings will be significant even without a special routing effort by the place and route software.

Although three different stacking technique embodiments are described above, there is no reason all three could not be designed into a single FPD depending on design considerations.

Regardless of the stacking technique employed, after the place and route step has been completed, the software must determine the programming of the memory cells that control virtual ground and/or virtual power transistors. As will be appreciated by one of ordinary skill, this is a straightforward procedure of identifying used and unused buffers and setting the virtual control memory cells with a "1" or a "0" as appropriate. The configuration data for programming virtual control memory cells will be included in the configuration data file for the device.

Returning to FIG. 2, depicted on the left hand side of the figure is a vertical line labeled LVS at the bottom and LVN at the top. This line represents four vertical long lines which may run for the height of the array, or half of the array height in a second embodiment. Each row and column has such long lines. However, for clarity they are only depicted in this single column.

Figure 7:
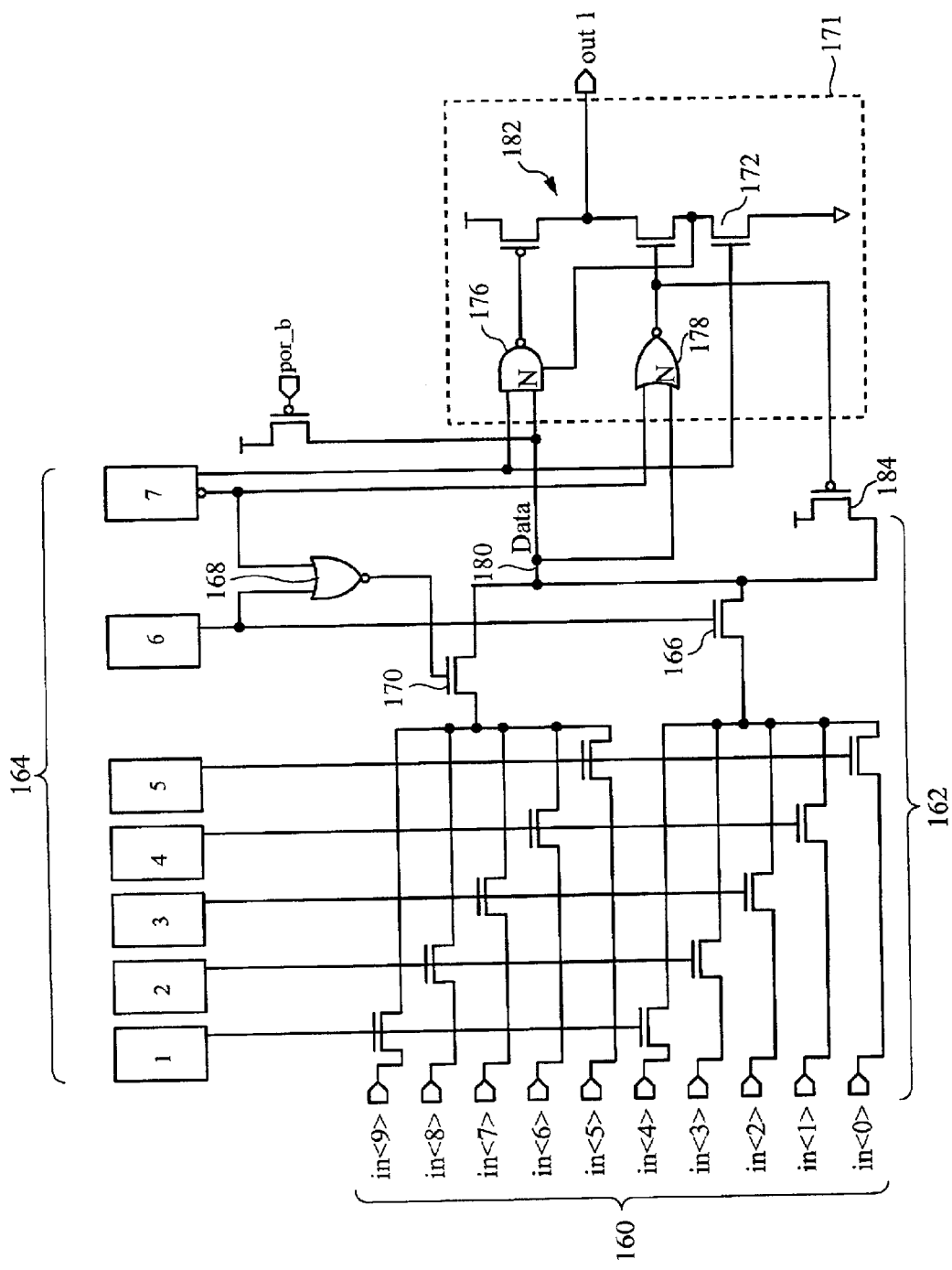
FIG. 7 is a schematic diagram of a vertical long line driver utilizing one embodiment of the stacking techniques of the present invention.

FIG. 7 is a circuit schematic showing the structure utilized to route signals onto a vertical long line such as that shown in FIG. 2. On the left hand side of the figure are ten inputs IN0–IN9 160. These inputs feed a two-stage pass transistor selection matrix 162 with two groups of five inputs in the first stage and two pass transistors controlling selection paths in the second stage. Across the top of FIG. 7 are seven memory cells 164 that control the selection matrix. From left to right, the first five memory cells control the first stage of the selection matrix in exactly the same manner as described with respect to FIG. 3. The sixth memory cell directly controls the lower pass transistor 166 in the second stage of the selection matrix in the same manner as described with respect to FIG. 3. The upper transistor 170 of the second stage is controlled by a two input NOR gate 168 that receives one of its inputs from the true output of the sixth memory cell, and its other input from the complemented output of the seventh memory cell. The upper pass transistor 170 will be "on" only when both inputs to NOR gate 168 are low. NOR gate 168 reduces leakage current by ensuring that top transistor 170 in the second stage is off when unused, and the NOR gate is smaller than a memory cell, thus saving space on the chip. The output of the seventh memory cell feeds several different structures in the circuit of FIG. 7. The seventh memory cell will be programmed with a logic "1" only if the vertical long line driver will be used in the user's design. If the driver is in use, NOR gate 168 will receive a "0" from the complemented output of the seventh memory cell. Thus, in this state NOR gate 168 will act as an inverter of the signal from the sixth memory cell, determining the conducting path in the second stage of selection matrix 162.

Figure 7A:
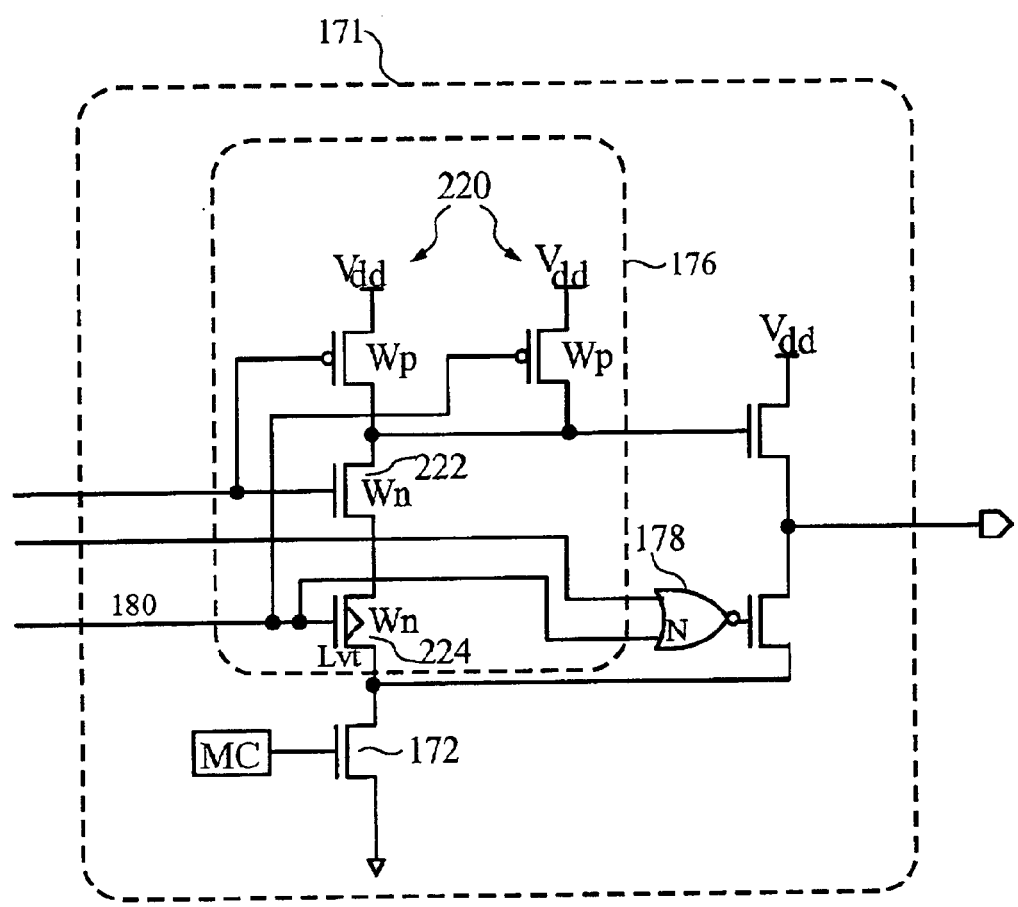
FIG. 7a shows detail of region 171 of FIG. 7.

The structures within the dashed region 171 combines to operate as a buffer which drives signals onto the long line. NAND gate 176 from region 171 is shown in greater detail in FIG. 7a. NAND gate 176 is made of two PMOS transistors 220 and two NMOS transistors 222 and 224. The operation of this NAND gate is readily apparent to one of ordinary skill in the art. As shown in FIG. 7a, the source of NMOS transistor 224 is connected to the drain of virtual ground transistor 172. Returning to FIG. 7, when the seventh memory cell is programmed with a logic "1", virtual ground transistor 172 in region 171 will be on, enabling the buffer. NAND gate 176 receives a logic "1" from the seventh memory cell and NOR gate 178 receives a logic "0" from the complemented output of the seventh memory cell. As will be appreciated by one of ordinary skill in the art, under these conditions both logic gates will invert their other input which comes from the data signal line 180 connected to the second common node of the pass transistor matrix 162. The second inverter 182 of the buffer then inverts the data signal again, completing the buffer function. A feedback path is provided from the output of NOR gate 178. If the data signal on signal line 180 is high, NOR gate 178 inverts the data signal, which causes PMOS transistor 184 to turn on and pull data line 180 high. If the data signal on node 180 is low, NOR gate 178 will output a high signal, turning PMOS transistor 184 off. As in FIG. 3, the por_b signal goes low only at power-up to cause all output signals to be logic 1. The transistor controlled by por_b is very small, and its static power leakage is therefore negligible.

Figure 8:
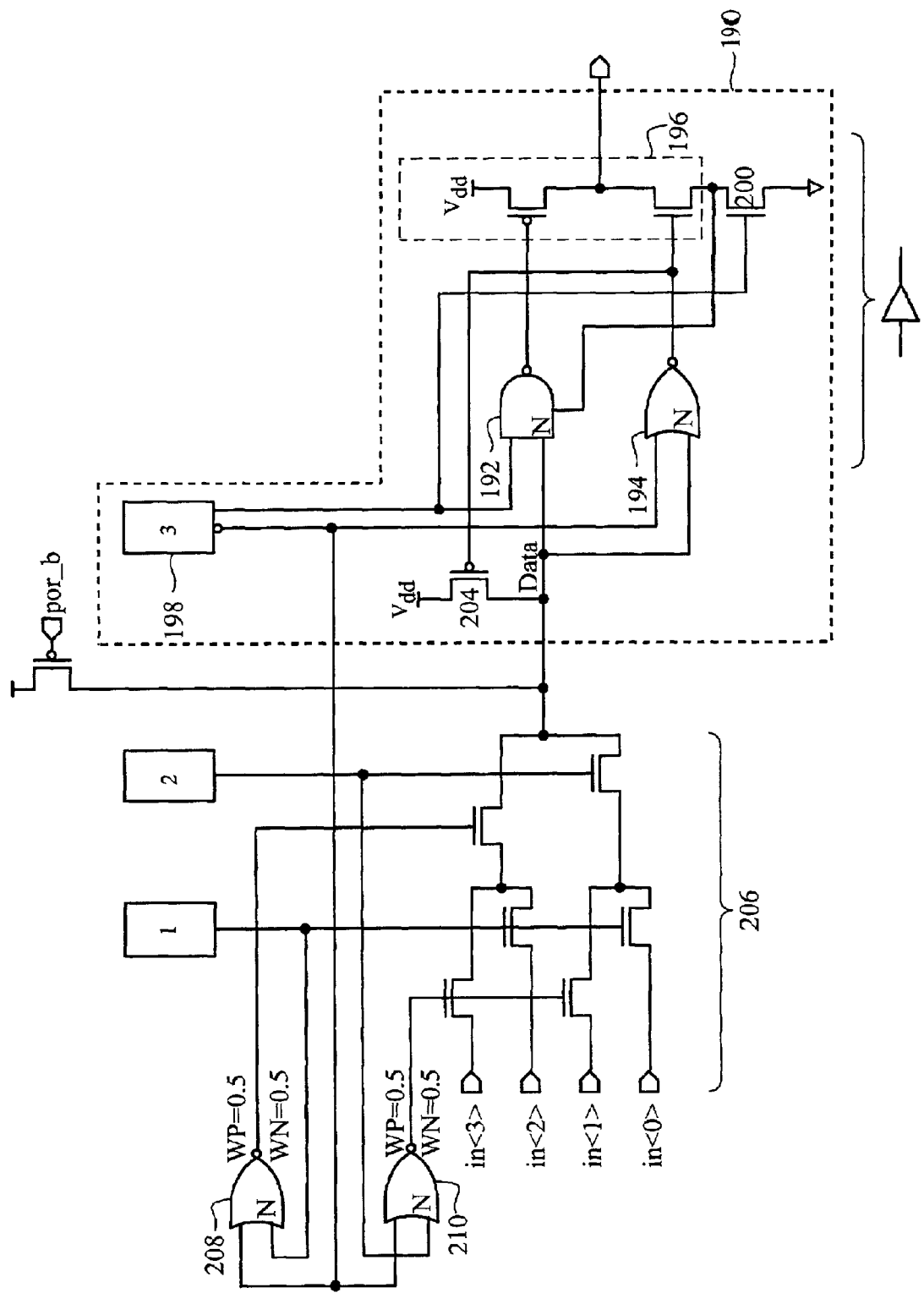
FIG. 8 is a schematic diagram of a horizontal long line driver utilizing one embodiment of the stacking techniques of the present invention.

FIG. 8 depicts the circuitry to drive signals onto horizontal long lines. Dashed region 190, comprised of NAND gate 192, NOR gate 194, inverter 196, memory cell 198, and virtual ground transistor 200, and PMOS transistor 204 operates in exactly the same manner as described with respect to FIG. 7. FIG. 8 differs from FIG. 7 in that selection matrix 206 has fewer inputs and includes two NOR gates 208, 210 as part of a decoding structure to select which signal will be passed to the buffer 190. NOR gates 208 and 210 each receive one input from the third memory cell 198. NOR gate 208 receives its second input from the first memory cell. NOR gate 210 receives its second input from the second memory cell. If the third memory cell is programmed with a logic "1" then the structure of FIG. 8 will be active. NOR gates 208 and 210 will invert the values programmed into the first and second memory cells respectively, and the programming of those memory cells will determine which signal is passed through selection matrix 206. The first memory cell in conjunction with NOR gate 208 controls the first stage of selection matrix 206. Likewise, the second memory cell in conjunction with NOR gate 210 controls the second stage of selection matrix 206. If the third memory cell is programmed with a "0", the outputs of NOR gates 208 and 210 will be low.

Although one stacking technique has been demonstrated with respect to FIGS. 7 and 8, each of the above disclosed techniques may be applied to the structures of these figures as well. For instance, it would be possible to group long line drivers into pairs as demonstrated in FIG. 6 for the OMUX driver. Although particular drivers in the example FPGA have been shown utilizing the various embodiments of the present invention, there are other drivers in the device to which these techniques can be applied. Furthermore, in general, the FPD industry is trending towards the use of more and more drivers on any given device to enhance speed and fan out capacity within the routing matrices on the FPDs, making the techniques of this invention more important as device sizes shrink.

The above description of the invention is intended to be illustrative and not limiting. Other embodiments of this invention will be obvious to those skilled in the art in view of the above disclosure.

What is claimed is:

1. A subthreshold current-efficient buffer comprising:
    first and second inverters connected in series;
    a memory cell;
    an NMOS transistor controlled by the memory cell and connected between the second inverter and ground; and
    a PMOS transistor controlled by a complemented output of the memory cell and connected between the first inverter and a power source,
    where the first inverter comprises a PMOS transistor manufactured to sit in a voltage well biased with a higher voltage than that of a power supply.

2. A subthreshold current-efficient circuit comprising:
    first and second buffers, each buffer having two inverters connected in series;
    an NMOS transistor connected in series between ground and the second inverter of each buffer;
    a PMOS transistor connected in series between a power source and the first inverter of each buffer; and
    a memory cell controlling both the NMOS transistor and the PMOS transistor,
    wherein the first and second buffers each comprise PMOS transistors manufactured to sit in a voltage well biased with a higher voltage than that of a power supply.

3. The subthreshold current-efficient circuit of claim 2 wherein the PMOS transistors in the first and second buffers form part of the first inverter of each buffer.

4. In a field programmable device having logic blocks and a routing matrix, an improved subthreshold current-efficient circuit comprising:
    at least one buffer for driving signals onto a signal line of the routing matrix;
    an NMOS transistor connected between ground and the at least one buffer;
    a PMOS transistor connected between power and the at least one buffer; and
    a memory cell connected to control the NMOS transistor and the PMOS transistor and turn them off when the at least one buffer is unused.

5. The field programmable device of claim 4 wherein the buffer comprises at least one PMOS transistor manufactured to sit in a voltage well biased with a higher voltage than that of a power supply.

6. In a field programmable device having CLEs and a routing matrix, an improved subthreshold current efficient circuit comprising:
    a plurality of buffers for driving signals on signal lines of the routing matrix, the plurality of buffers being grouped in pairs wherein each buffer pair comprises an NMOS transistor connected between ground and the buffer pair and a PMOS transistor connected between a power source and the buffer pair;
    a corresponding memory cell connected to control each NMOS and PMOS transistor and turn them off when their associated buffer pair is unused.

7. The field programmable device of claim 6 wherein the plurality of buffers comprise at least one PMOS transistor manufactured to sit in a voltage well biased with a higher voltage than that of a power supply.

8. A method of reducing subthreshold current in a field programmable device (FPD) comprising the steps of:
    providing virtual ground transistors on selected buffers within an FPD;
    providing virtual power transistors on the selected buffers;
    providing memory cells to control the state of the virtual ground and power transistors;
    programming the memory cells to turn off the virtual ground and power transistors of the buffers that are not being used.

9. The method of claim 8 further comprising providing selected buffers within the FPD which have PMOS transistors manufactured to sit in a voltage well biased with a higher voltage than that of a power supply.

10. The method of claim 8 further comprising providing virtual ground and power transistors to control logic gates used as the first stage of a buffer.

11. A buffer, comprising:
    first and second inverters coupled in series;
    a memory cell;
    a first transistor controlled by a first output of the memory cell and coupled between the second inverter and ground; and
    a second transistor controlled by a second output of the memory cell and coupled between the first inverter and a power source,
    where the first inverter comprises a PMOS transistor manufactured to sit in a voltage well biased with a higher voltage than that of a power supply.

12. The buffer of claim 11, wherein the memory cell comprises a configuration memory cell of a field programmable device.

* * * * *